(12) United States Patent
Zhang

(10) Patent No.: US 8,179,171 B1
(45) Date of Patent: May 15, 2012

(54) POWER UP CIRCUIT

(75) Inventor: Yong Zhang, Fremont, CA (US)

(73) Assignee: Synopsys Inc., Mountain View, CA (US)

( * ) Notice: Subject to any disclaimer, the term of this patent is extended or adjusted under 35 U.S.C. 154(b) by 425 days.

(21) Appl. No.: 12/057,355

(22) Filed: Mar. 27, 2008

(51) Int. Cl.
*H03L 7/00* (2006.01)
(52) U.S. Cl. .......................................... 327/143; 327/81
(58) Field of Classification Search .......... 327/142–143, 327/198, 77, 78, 80, 81
See application file for complete search history.

(56) References Cited

U.S. PATENT DOCUMENTS

| 4,409,501 A | * | 10/1983 | Eickerman et al. | 327/143 |
| 5,467,037 A | * | 11/1995 | Kumar et al. | 327/142 |
| 6,084,454 A | * | 7/2000 | Holst | 327/198 |

OTHER PUBLICATIONS

Weste et al., Principles of CMOS VLSI Design, A Systems Perspective, $2^{nd}$ Edition, ISBN: 0-201-53376-6, Addison Wesley, 1993, pp. 78-79.*

* cited by examiner

*Primary Examiner* — Long Nguyen
(74) *Attorney, Agent, or Firm* — Evergreen Valley Law Group, P.C.; Kanika Radhakrishnan

(57) ABSTRACT

Power up circuit. An example power up circuit includes a switch for charging a power node of an electronic device. A level detector is used for monitoring charge level of the power node. Further, the power up circuit includes one or more power switches for providing current to the electronic device based on the charge level.

18 Claims, 4 Drawing Sheets

POWER UP CIRCUIT

BACKGROUND

Electronic devices, for example, memories have different power requirements in different states. Examples of different states include but are not limited to a standby state and an active state. A memory includes a power node which needs to be charged or powered when the memory transitions from one state to another. In 65 nanometer (nm) memory design, a Positive-channel metal oxide semiconductor (PMOS) is used as a switch to connect the power node with external power supply. During the standby mode the switch is off to reduce peripheral leakage. The PMOS used is of large size to provide current to the memory in active mode. When the memory is switched from standby state to active state the PMOS is turned ON. The turning ON of the large PMOS leads to surge current as the drain of the PMOS connected to the power node is at ground level and the source of the PMOS is at external power supply level. The surge current causes severe strain on the power supply and may even damage power supply. Further, the surge current generates heat and may lead to failure of the electronic devices. Moreover, the surge current also causes electrical migration due to presence of metal in the electronic devices. Therefore, a technique to minimize surge current during charging the power node is needed.

In a conventional method of minimizing surge current a delay chain is used to slow down charging the power node. FIG. 1 illustrates a prior art circuit 100 for charging a power node 110 of a memory 111 through a plurality of PMOS switches including a PMOS switch 105a, a PMOS switch 105b and a PMOS switch 105n. A delay chain 115 includes a plurality of inverter circuits including an inverter circuit 120a and an inverter circuit 120m connected in series to sequentially activate the plurality of PMOS switches in response to an input activation signal applied to PMOS switch 105a and inverter circuit 120a. The delay between activation of the $n^{th}$ PMOS switch and the $(n+1)^{th}$ PMOS switch is a few ten picoseconds. The number of inverters needed to avoid overloading power supply is proportional to current drain imposed by the memory at start-up, leading to increased area of a chip including the memory, which in turn increases cost. Moreover, in the chip with hundred of memories the input activation signal is a common signal. When the input activation signal is applied PMOS switch 105a of all the memories are turned ON simultaneously leading to huge current. Similarly, PMOS switch 105b, followed by other PMOS switches, of all the memories are turned ON simultaneously.

In light of the foregoing discussion, there is a need of an efficient technique for minimizing surge current during charging the power node.

SUMMARY

Embodiments of the invention described herein provide a method and a system to power up an electronic device.

An example power up circuit includes a switch for charging a power node of an electronic device. A level detector is used for monitoring charge level of the power node. Further, the power up circuit includes one or more power switches for providing current to the electronic device based on the charge level.

An example system includes a switch for charging a power node of a memory. A level detector is used for monitoring charge level of the power node. Further, the system includes one or more power switches for providing current to the memory based on the charge level.

An example method includes charging a power node of a memory. Charge level of the power node is then monitored. Further, current is provided to the memory based on the charge level.

DETAILED DESCRIPTION OF THE EMBODIMENTS

Embodiments of the invention provide a method and a system to power up an electronic device, for example, memory. An example power up circuit includes a switch for charging a power node of the electronic device. A level detector is used for monitoring charge level of the power node. Further, the power up circuit includes one or more power switches for providing current to the electronic device based on the charge level.

Figure 1:
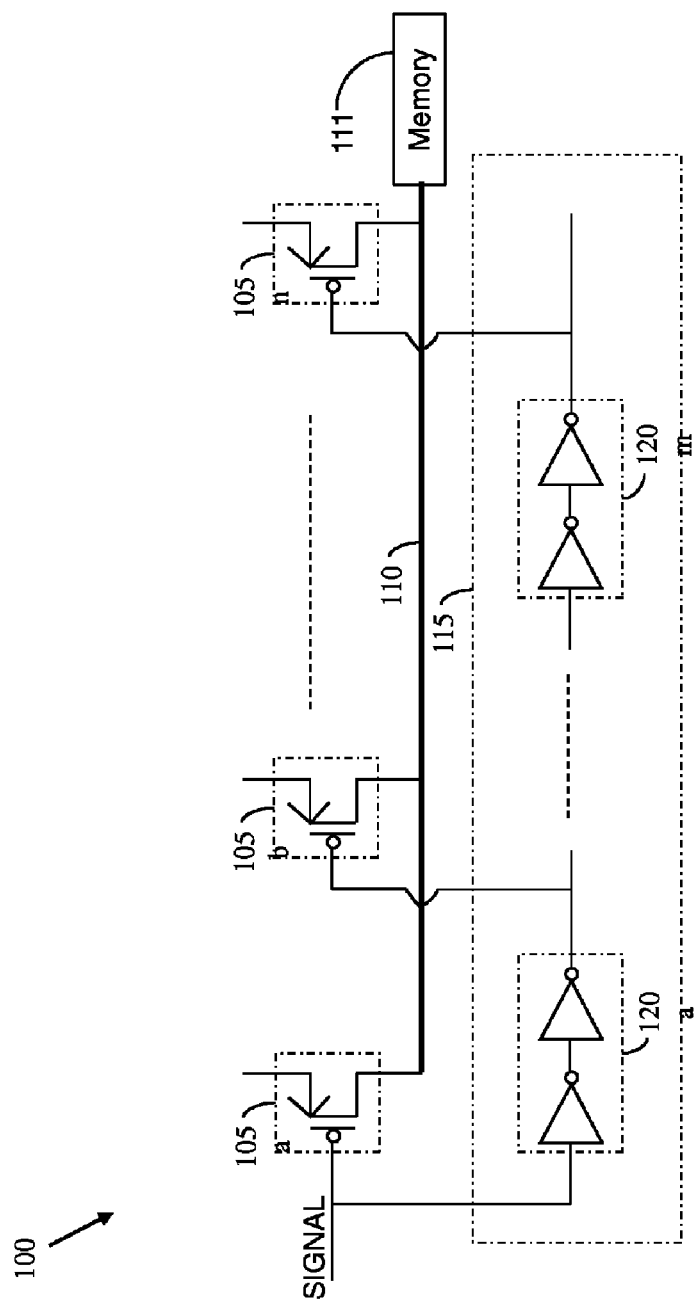
FIG. 1 illustrates a prior art circuit for charging a power node.
Figure 2:
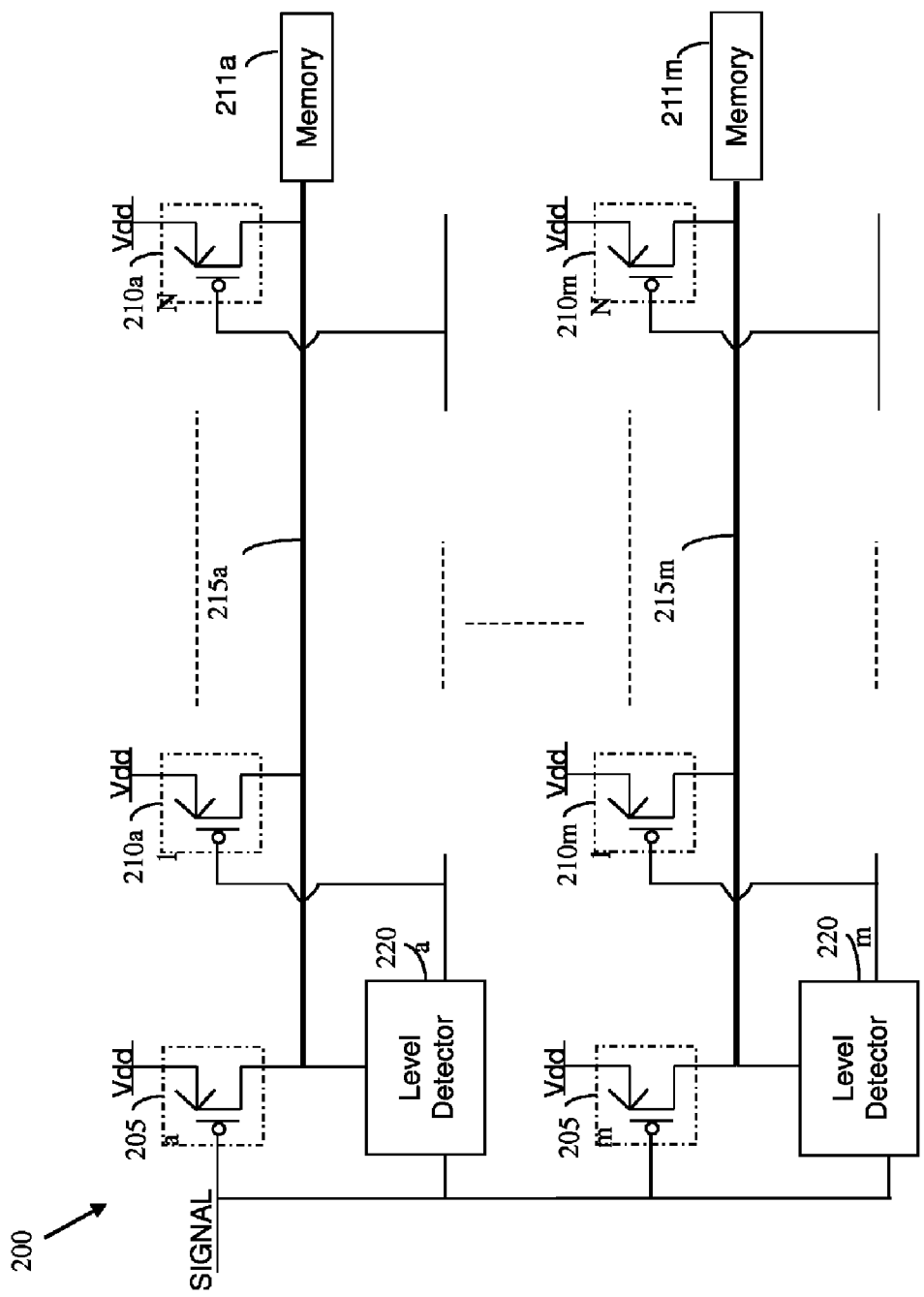
FIG. 2 illustrates an environment in accordance with an embodiment of the invention.

FIG. 2 is an environment 200 in accordance with an embodiment of the invention. Environment 200 includes one or more electronic devices, for example, memories 211a and 211m. Each electronic device includes a power node, for example, a power node 215a and a power node 215m. Power node 215a and power node 215m are connected to external power supply (Vdd) through a switch 205a and a switch 205m respectively. A level detector 220a and a level detector 220m monitor charge level of power node 215a and power node 215m respectively. One or more power switches, for example, a power switch 210a1, a power switch 210aN, a power switch 210m1 and a power switch 210mN provide current to the electronic devices based on the charge level of corresponding power nodes.

In an embodiment of the invention, the electronic devices include ultra low power memories. Examples of memories include but are not limited to single port static random access memories (SRAMs), dual port SRAMs, asynchronous dual port register file.

In an embodiment of the invention, switch 205a and switch 205m include switching transistors such as metal-oxide semiconductor (MOS) transistors. In the embodiment shown, positive-channel MOS transistors (PMOS) are employed. Such transistors can be fabricated in very small sizes if desired. Switch 205a and switch 205m are used to slowly charge power node 215a and power node 215m respectively.

In an embodiment of the invention, power node 215a and power node 215m may have different power requirement due to different sizes of the electronic devices. Charging time of power node 215a and power node 215m may also be different if switch 205a and switch 205m are of same size, and the electronic devices including power node 215a and power node 215m, respectively, are of different sizes.

In an embodiment of the invention, the one or more power switches are of sufficiently large size to provide current to the electronic devices in active mode. The size of the one or more power switches may vary with different sizes of the electronic devices.

Figure 3:
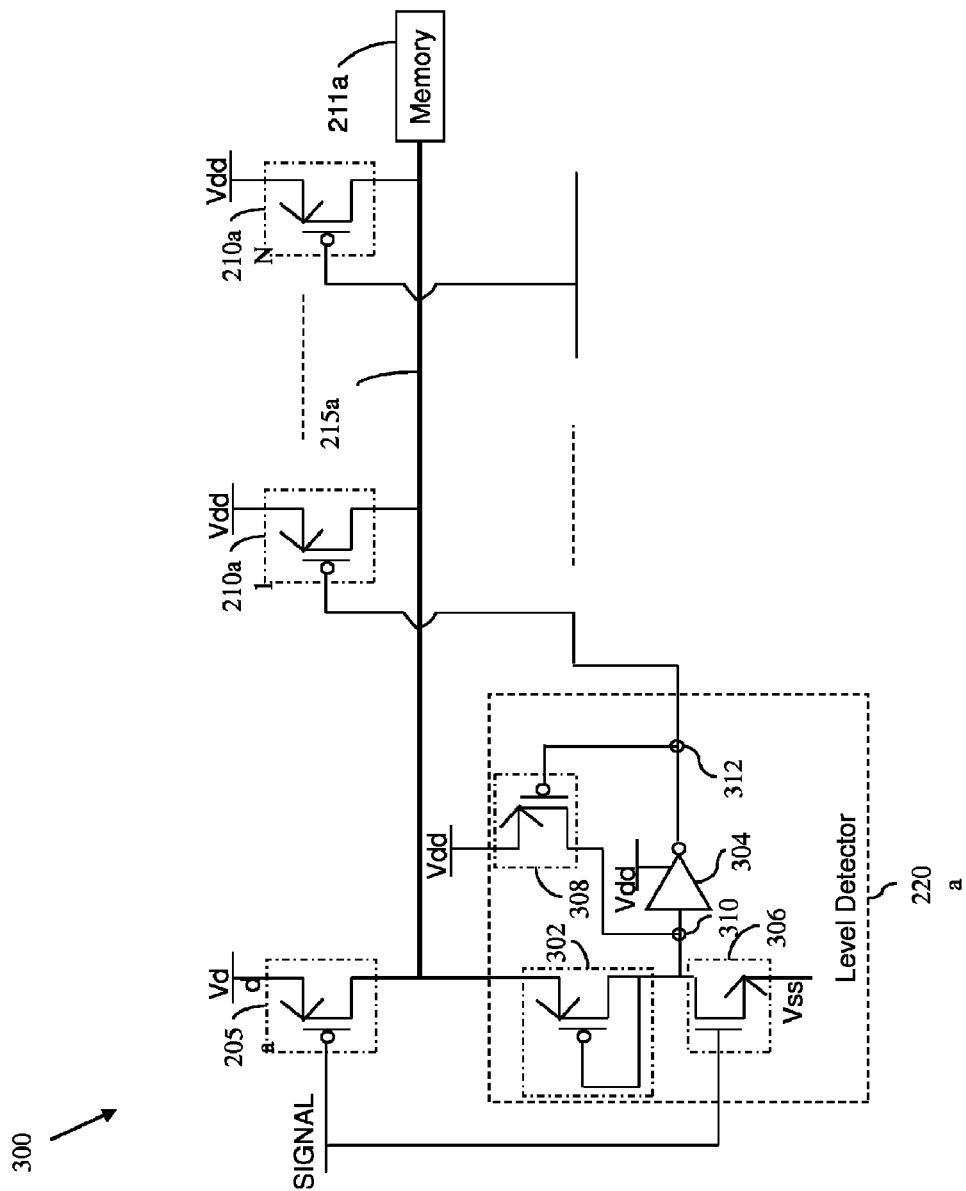
FIG. 3 illustrates a circuit for charging a power node in accordance with an embodiment of the invention.

FIG. 3 is a circuit 300 for charging a power node in accordance with an embodiment of the invention. Circuit 300 includes switch 205a, power switch 210a1, power switch 210aN, power node 215a and level detector 220a. Drains of power switch 210a1, of power switch aN, and of any other power switches as indicated by broken lines in FIG. 3 are connected to power node 215a.

In an embodiment of the invention, level detector 220a includes a PMOS diode 302 with a cathode connected to power node 215a and an anode connected to a drain of an NMOS transistor 306 at a node 310. A gate of NMOS transistor 306 receives an input activation signal. A source of NMOS transistor 306 goes to a common return Vss. An input of an inverter 304 and a drain of a PMOS transistor 308 are connected to node 310. An output of inverter 304 and a gate of PMOS transistor 308 are connected through a node 312 to a gate of power switch 210a1, a gate of power switch 210aN, and any gates of any other power switches as indicated by broken lines in FIG. 3. A drain of the transistor 308 is connected to node 310.

PMOS diode 302 maintains a voltage drop of Vtp (threshold voltage) between power node 215a and first node 310. Inverter 304 controls switching of power switch 210a1 and power switch 210aN.

In an embodiment of the invention, charge level of power node 215a is monitored and when the charge level reaches a certain level, inverter 304 is flipped to turn ON power switch 210a1 and power switch 210aN.

In an embodiment of the invention, power node 215a is included in a memory. Power switch 210a1 and power switch 210aN are large enough to provide active current for the memory. Switch 205a and PMOS diode 302 are of small size. In standby state of the memory, SIGNAL is HIGH; switch 205a, power switch 210a1 and power switch 210aN are OFF; second node 312 is HIGH; and power node 215a and first node 310 are LOW. When the SIGNAL switches from HIGH to LOW, power node 215a is slowly charged by switch 205a. During charging there is always a drop of Vtp from power node 215a to first node 310. When the charge level or voltage of power node 215a reaches the certain level, the voltage of first node 310 rises to trigger point (Vtri) of inverter 304. In an embodiment of the invention, the certain level and Vtri of inverter 304 is 50% of the external supply voltage. When the voltage of first node 310 rises to Vtri, the output of inverter 304 flips from HIGH to LOW making second node 312 LOW. Power switch 210a1 and power switch 210aN turns ON as second node 312 is LOW. When power switch 210a1 and power switch 210aN turns ON the voltage of power node 215a is Vtp+Vtri. The sources of power switch 210a1 and power switch 210aN are at external supply voltage level and the drains of power switch 210a1 and power switch 210aN are at Vtp+Vtri level. Power switch 210a1 and power switch 210aN are turned ON in linear region as the difference between the source voltage and the drain voltage is less than the threshold voltage. The current flowing through power switch 210a1 and power switch 210aN is also small.

In an embodiment of the invention, charge current of power node 215a may be adjusted by varying size of switch 205a.

In an embodiment of the invention, voltage of power node 215a may be adjusted by adjusting Vtri of inverter 304.

The working of circuit 300 is explained with help of exemplary values below:

In an embodiment of the invention, power node 215a is included in a 65 nanometer (nm) memory. The external supply voltage is 1.0 volts (V). The certain level or charge level of power node 215a is set at 0.5 V by setting Vtri of inverter as 0.5 V (50% of the external supply voltage). The Vtp is about 0.28 V. When output of inverter 304 is flipping first node 310 is up to 0.5 V and power node 215a is up to 0.78 V (0.5+0.28).

Second node 312 turns to LOW when first node reaches 0.5 V, turning ON power switch 210a1 and power switch 210aN. Power switch 210a1 and power switch 210aN are turned ON in linear region as the sources are at 1.0 V and the drains are at 0.78 V making the difference (1−0.78=0.22 V) between the source voltage and the drain voltage less than the threshold voltage (0.28 V).

It will be appreciated that the circuits described in FIG. 2 and FIG. 3 may include variations. For example, the circuits may include a fewer or greater number of elements, for example, diodes, transistors, inverters than that shown in FIG. 2 and FIG. 3. Further, other elements may be used in place of the elements used in FIG. 2 and FIG. 3, for example, using a conventional diode instead of the PMOS diode.

Figure 4:
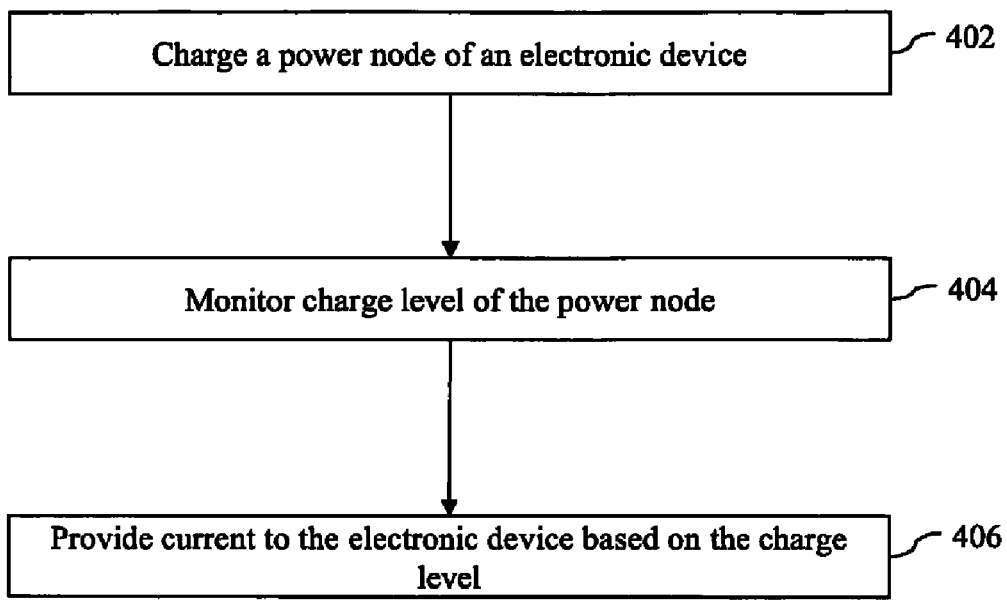
FIG. 4 illustrates a method for powering electronic devices in accordance with an embodiment of the invention.

FIG. 4 is a flowchart illustrating a method for powering electronic devices, for example, memories in accordance with an embodiment of the invention. At step 302, a power node of an electronic device is charged. In an embodiment of the invention, the charging is performed by providing charge current through a switch.

At step 304, charge level of the power node is monitored. In an embodiment of the invention, the charge level is monitored by checking if the power node has been charged to a certain level. The certain level may be defined as a percentage of an external supply voltage. In an embodiment of the invention, the certain level is 50% of the external supply voltage.

At step 306, current is provided to the electronic device based on the charge level. In an embodiment of the invention, the current is provided using one or more power switches which are controlled by setting a trigger point of an inverter to the certain level of the power node. When the charge level reaches the certain level, the trigger point is also reached and output of the inverter flips to turn ON the one or more power switches.

In an embodiment of the invention, one or more steps of the method described in FIG. 4 may be implemented using a machine-readable medium product. Examples of the machine-readable medium product include but are not limited to memory devices, tapes, disks, cassettes, integrated circuits, servers, magnetic media, optical media, online software, download links, installation links, and online links.

Various embodiments of the invention improve area efficiency by using the level detector. The level detector does not include transistors that may burn power by itself. Further, the delay time for turning on the power switches is varied automatically with size of the electronic devices. This helps in minimizing surge current and overlapping of peak current for various electronic devices as the one or more power switches are not turned ON simultaneously for hundreds of electronic devices with different sizes. Moreover, the one or more power switches are turned ON in the linear region with less difference between the source voltage and the drain voltage, which minimizes the surge current.

While embodiments of the invention are disclosed in terms of exemplary embodiments, it can be practiced in a number of ways as defined by the scope of the appended claims. Additionally, various features of embodiments of the invention can be modified in a myriad of ways to achieve the goal of powering an electronic device.

What is claimed is:
1. A power up circuit comprising:
   a power node;
   a charging switch responsive to a power-on signal to establish an electrical charging current from a power source to the power node;

a voltage divider connected to the power node and responsive to the power-on signal to provide a trigger signal indicative of voltage on the power node;

at least two power switches connected between the power node and the power source; and a level detector, responsive to the trigger signal, to activate the power switches simultaneously when the trigger signal reaches a predetermined voltage.

2. The power up circuit of claim 1, wherein the level detector comprises: an inverter having an input that receives the trigger signal and an output coupled to the power switches.

3. The power up circuit of claim 2 wherein the level detector comprises a transistor having a gate connected to the output of the inverter, a source connected to the power source, and a drain connected to the input of the inverter.

4. The power up circuit of claim 3 wherein the power switches are in parallel connection with each other and the voltage divider comprises a metal oxide semiconductor diode in series with a MOSFET transistor.

5. The power up circuit of claim 1, wherein the voltage divider comprises a metal oxide semiconductor diode.

6. The power up circuit of claim 1 wherein the voltage divider comprises a metal oxide semiconductor diode in series with a MOSFET transistor.

7. The power up circuit of claim 1 wherein the power switches are in parallel connection with each other.

8. A memory system comprising:

a memory having a power input;

a charging switch responsive to a power-on signal to establish an electrical charging current from a power source to the power input;

a voltage divider connected to the power input and responsive to the power-on signal to provide a trigger signal indicative of voltage at the power input;

at least two power switches connected between the power input and the power source; and a level detector, responsive to the trigger signal to activate the power switches simultaneously when the trigger signal reaches a predetermined voltage.

9. The memory system of claim 8, wherein the level detector comprises: an inverter having an input that receives the trigger signal and an output coupled to the first and second power switches.

10. The memory system of claim 9 wherein the level detector comprises a transistor having a gate connected to the output of the inverter, a source connected to the power source, and a drain connected to the input of the inverter.

11. The memory system of claim 10 wherein the power switches are in parallel connection with each other and the voltage divider comprises a metal oxide semiconductor diode in series with a MOSFET transistor.

12. The memory system of claim 8, wherein the voltage divider comprises a metal oxide semiconductor diode.

13. The memory system of claim 8 wherein the voltage divider comprises a metal oxide semiconductor diode in series with a MOSFET transistor.

14. The power up circuit of claim 8 wherein the power switches are in parallel connection with each other.

15. A method of applying power to an electronic device comprising:

charging a power node of the electronic device from a power supply having a voltage Vdd;

comparing a charge level of the power node with the voltage Vdd; and when the charge level of the power node reaches a predetermined fraction of the voltage Vdd, applying substantially full power to the power node by simultaneously activating at least two parallel power switches each connected between the power supply and the power node.

16. The method of claim 15, wherein the electronic device comprises a memory.

17. A method of applying power to an electronic device comprising:

charging a power node of the electronic device from a power supply having a voltage Vdd;

comparing a charge level of the power node with the voltage Vdd by receiving a portion of the charge level of the power node through a voltage divider and applying that portion to an input of an inverter; and when the charge level of the power node reaches a predetermined fraction of the voltage Vdd, applying substantially full power to the power node.

18. The method of claim 17, wherein the electronic device comprises a memory.

* * * * *